US010404267B2

(12) United States Patent
Maehata

(10) Patent No.: US 10,404,267 B2
(45) Date of Patent: Sep. 3, 2019

(54) TRANSMISSION SYSTEM AND WIRELESS COMMUNICATION SYSTEM

(71) Applicant: SUMITOMO ELECTRIC INDUSTRIES, LTD., Osaka-shi, Osaka (JP)

(72) Inventor: Takashi Maehata, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 16/095,722

(22) PCT Filed: Apr. 5, 2017

(86) PCT No.: PCT/JP2017/014249
§ 371 (c)(1),
(2) Date: Oct. 23, 2018

(87) PCT Pub. No.: WO2017/187917
PCT Pub. Date: Nov. 2, 2017

(65) Prior Publication Data

US 2019/0173513 A1 Jun. 6, 2019

(30) Foreign Application Priority Data

Apr. 25, 2016 (JP) ................................ 2016-087077

(51) Int. Cl.
*H03M 3/00* (2006.01)
*H04B 1/44* (2006.01)

(52) U.S. Cl.
CPC ............... *H03M 3/30* (2013.01); *H03M 3/32* (2013.01); *H03M 3/402* (2013.01); *H03M 3/422* (2013.01); *H04B 1/44* (2013.01)

(58) Field of Classification Search
CPC ........ H03M 3/32; H03M 3/402; H03M 3/422; H04B 1/38
See application file for complete search history.

(56) References Cited

U.S. PATENT DOCUMENTS 10,224,937 B1 * 3/2019 Wu .......................... H04L 1/00
2015/0109157 A1 * 4/2015 Caldwell .............. H03M 3/458 341/143
2016/0013805 A1 * 1/2016 Maehata .............. H03M 3/422 341/143

FOREIGN PATENT DOCUMENTS

JP 2014-165846 A 9/2014
JP 2017-5655 A 1/2017

* cited by examiner

*Primary Examiner* — Devan A Sandiford
(74) *Attorney, Agent, or Firm* — Drinker Biddle & Reath LLP

(57) ABSTRACT

Provided is a transmission system including: a signal processing apparatus 2 configured to transmit, via a signal cable 4, a delta-sigma modulated signal obtained by performing delta-sigma modulation on a transmission signal that is an RF signal; and a wireless apparatus 3 configured to transmit, via the signal cable 4, a reception signal that is an RF signal. The signal processing apparatus 2 transmits the delta-sigma modulated signal to the wireless apparatus 3, and the wireless apparatus 3 transmits the reception signal to the signal processing apparatus 2. In the delta-sigma modulated signal, quantization noise is suppressed at the frequency of the reception signal. The reception signal is transmitted to the signal processing apparatus 2 while the delta-sigma modulated signal is being transmitted to the wireless apparatus 3.

10 Claims, 10 Drawing Sheets

TRANSMISSION SYSTEM AND WIRELESS COMMUNICATION SYSTEM

TECHNICAL FIELD

The present invention relates to transmission systems and wireless communication systems.

This application claims priority on Japanese Patent Application No. 2016-087077 filed on Apr. 25, 2016, the entire contents of which are incorporated herein by reference.

BACKGROUND ART

Conventionally, a signal obtained by performing delta-sigma modulation on an analog transmission signal has been wirelessly transmitted (refer to Patent Literature 1, for example).

CITATION LIST

Patent Literature

PATENT LITERATURE 1: Japanese Laid-Open Patent Publication No. 2014-165846

SUMMARY OF INVENTION

A transmission system as one embodiment includes: a first apparatus configured to transmit, via a signal transmission path, a delta-sigma modulated signal obtained by performing delta-sigma modulation on a first signal that is an RF signal; and a second apparatus configured to transmit, via the signal transmission path, a second signal that is an RF signal. The first apparatus transmits the delta-sigma modulated signal to the second apparatus. The second apparatus transmits the second signal to the first apparatus. In the delta-sigma modulated signal, quantization noise is suppressed at the frequency of the second signal. The second signal is transmitted to the first apparatus while the delta-sigma modulated signal is being transmitted to the second apparatus.

A wireless communication system according to one embodiment includes the aforementioned transmission system, and is configured to wirelessly transmit the first signal. The second apparatus includes a plurality of reception units configured to receive the delta-sigma modulated signal. The plurality of reception units include: a plurality of wireless transmission units configured to wirelessly transmit the first signal obtained from the delta-sigma modulated signal; and a control unit configured to adjust timings of the delta-sigma modulated signal in the plurality of wireless transmission units, thereby adjusting transmission timings of the first signal to be wirelessly transmitted from the respective wireless transmission units.

DESCRIPTION OF EMBODIMENTS

Technical Problem

Figure 9:
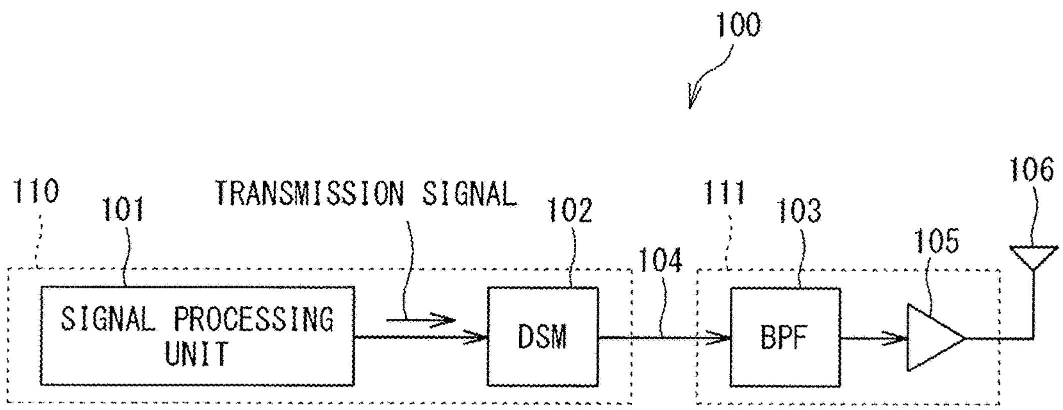
FIG. 9 is a diagram showing an example of a communication system including a delta-sigma modulator.

FIG. 9 shows an example of a communication system including a delta-sigma modulator. As shown in FIG. 9, the communication system 100 includes: a signal processing unit 101 configured to output a transmission signal that is an RF signal; a delta-sigma modulator (DSM) 102 to which the transmission signal is provided; and a band-pass filter 103.

The delta-sigma modulator 102 performs delta-sigma modulation on the transmission signal, and outputs a delta-sigma modulated signal. The delta-sigma modulated signal is provided to the band-pass filter 103 via a signal transmission path 104.

The band-pass filter 103 has a passband that allows the transmission signal to pass therethrough. Therefore, the band-pass filter 103 eliminates quantization noise included in the delta-sigma modulated signal while allowing the transmission signal to pass therethrough. Thus, the band-pass filter 103 outputs the transmission signal.

The transmission signal outputted from the band-pass filter 103 is amplified by a power amplifier 105 in the subsequent stage, and is transmitted as a radio wave from an antenna 106.

In the communication system 100 shown in FIG. 9, the transmission signal can be transmitted as a delta-sigma modulated signal, which is a digital signal (pulse signal), between the delta-sigma modulator 102 and the band-pass filter 103. Therefore, even when the signal transmission path 104 connecting the delta-sigma modulator 102 and the band-pass filter 103 is relatively long, attenuation of the signal can be suppressed.

Therefore, the signal processing unit 101 and the delta-sigma modulator 102 are unitized as a signal processing device 110, the band-pass filter 103, the power amplifier 105, and the antenna 106 are unitized as a wireless apparatus 111, and the devices 110 and 111 are connected to each other via the signal transmission path 104. In this case, the signal processing device 110 and the wireless apparatus 111 can be installed at separated positions, whereby flexibility of the installation mode of the communication system 100 can be ensured.

That is, the signal processing apparatus 110 and the wireless apparatus 111 constitute a transmission system that performs transmission of the delta-sigma modulated signal outputted from the delta-sigma modulator, via the signal transmission path 104.

In the system shown in FIG. 9 that performs transmission of the delta-sigma modulated signal, the transmission signal is wirelessly transmitted. However, for example, when the antenna 106 is used for both transmission and reception or when the transmission signal is fed back to the signal processing unit, it is necessary to transmit an RF signal such as a reception signal, a feedback signal of the transmission signal, etc., from the wireless apparatus 111 to the signal processing apparatus 110.

In this case, if a path for transmitting the RF signal from the wireless apparatus 111 to the signal processing apparatus 110 is newly provided, a transmission line for transmitting the signal, a function required for transmission/reception of the signal, etc. need to be added, which disadvantageously causes an increase in the size of the entire communication system 100.

Therefore, it is considered to transmit the RF signal by using the signal transmission path 104 connecting the signal processing apparatus 110 to the wireless apparatus 111.

In the delta-sigma modulated signal outputted from the delta-sigma modulator 102, a band containing the transmission signal as a main signal component is subjected to noise shaping to suppress noise in the band, whereas other bands contain quantization noise over a wide range.

Therefore, if the RF signal is attempted to be transmitted by use of the signal transmission path 104 to which the delta-sigma modulated signal outputted from the delta-sigma modulator 102 is provided, the RF signal is superimposed on the quantization noise of the delta-sigma modulated signal, which makes it difficult to transmit the RF signal with an appropriate signal quality.

The present disclosure has been made in view of the above circumstances. An object of the present invention is to provide a technology that allows a signal transmission path for transmitting a delta-sigma modulated signal to transmit an RF signal.

Advantageous Effects of Disclosure

According to the present disclosure, it is possible to allow a signal transmission path for transmitting a delta-sigma modulated signal to transmit an RF signal.

DESCRIPTION OF EMBODIMENTS

First, contents of embodiments will be listed for description.

(1) A transmission system according to one embodiment includes: a first apparatus configured to transmit, via a signal transmission path, a delta-sigma modulated signal obtained by performing delta-sigma modulation on a first signal that is an RF signal; and a second apparatus configured to transmit, via the signal transmission path, a second signal that is an RF signal. The first apparatus transmits the delta-sigma modulated signal to the second apparatus. The second apparatus transmits the second signal to the first apparatus. In the delta-sigma modulated signal, quantization noise is suppressed at a frequency of the second signal. The second signal is transmitted to the first apparatus while the delta-sigma modulated signal is being transmitted to the second apparatus.

In the transmission system having the aforementioned configuration, the second signal provided to the signal transmission path by the second apparatus can be inhibited from being superimposed on quantization noise in the delta-sigma modulated signal. Therefore, the signal transmission path for transmitting the delta-sigma modulated signal can be caused to transmit the second signal as an RF signal.

(2) In the aforementioned transmission system, the first apparatus may include a delta-sigma modulator configured to perform delta-sigma modulation on the first signal, and the delta-sigma modulator may have a characteristic to stop quantization noise in a frequency band including the frequency of the first signal and the frequency of the second signal.

In this case, since the delta-sigma modulator stops quantization noise in the frequency band including the frequency of the first signal and the frequency of the second signal, the second signal can be inhibited from being superimposed on the quantization noise in the delta-sigma modulated signal.

(3) In the aforementioned transmission system, the first apparatus may include a delta-sigma modulator configured to perform delta-sigma modulation on the first signal, and the delta-sigma modulator may have a characteristic to stop quantization noise in a first frequency band including the frequency of the first signal, and stop quantization noise in a second frequency band including the frequency of the second signal.

In this case, even if the frequency of the second signal is different from the frequency of the first signal, superimposition of the second signal on the quantization noise can be inhibited.

(4) In the aforementioned transmission system, the first apparatus preferably includes a delta-sigma modulator configured to perform delta-sigma modulation on the first signal, and a band elimination filter to which an output from the delta-sigma modulator is provided and which has a signal elimination band including the frequency of the second signal. An output from the band elimination filter is preferably transmitted as the delta-sigma modulated signal to the second apparatus.

(5) In the aforementioned transmission system, the second signal may be a reception signal received by a reception device configured to receive a radio signal.

(6) In the aforementioned communication system, the second signal may be a feedback signal of a transmission signal that is wirelessly transmitted by a transmission device configured to transmit a radio signal.

(7) In the aforementioned transmission system, the first apparatus preferably includes: a processing unit configured to process the second signal; and a bandpass filter connected between the processing unit and the signal transmission path, and having a signal pass band including the frequency of the second signal.

In this case, the first apparatus can easily obtain the second signal with a simple structure.

(8) In the aforementioned transmission system, the second apparatus preferably includes a binarizer configured to binarize the delta-sigma modulated signal provided through the signal transmission path.

In this case, even if the delta-sigma modulated signal provided to the second apparatus through the signal transmission path is attenuated while being transmitted, the delta-sigma modulated signal in which influence of attenuation is mitigated can be obtained by binarizing, with the binarizer, the delta-sigma modulated signal as a binary pulse signal.

(9) A wireless communication system according to one embodiment is a wireless communication system that includes the transmission system described in the above (1) and is configured to wirelessly transmit the first signal. In the wireless communication system, the second apparatus includes a plurality of reception units configured to receive the delta-sigma modulated signal. The plurality of reception units include: a plurality of wireless transmission units, respectively, configured to wirelessly transmit RF signals obtained from the delta-sigma modulated signal; and a control unit configured to adjust timings of the delta-sigma modulated signal in the plurality of wireless transmission units, thereby adjusting transmission timings of the first signal to be wirelessly transmitted from the respective wireless transmission units.

In this case, relative transmission timings of the RF signals to be wirelessly transmitted by the plurality of wireless transmission units can be accurately adjusted, for example, the transmission timings in the respective wireless transmission units can be synchronized with each other, with a simple structure, without the necessity of adjusting exactly the physical line lengths of signal transmission paths or making the transmission characteristics of the signal transmission paths coincide exactly with each other.

(10) Further, in this case, a plurality of signal transmission paths configured to connect the plurality of reception units to the first apparatus may form a multicore wire having the plurality of signal transmission paths as a core wire. In this case, connection of the first apparatus to the second apparatus is facilitated. Furthermore, in this case, even if mutual interference occurs between the respective signal transmission paths and thereby delay or the like occurs in the signal timings, the control unit can adjust the transmission timings.

DETAILS OF EMBODIMENTS

Hereafter, preferred embodiments will be described with reference to the drawings. At least some parts of the embodiments described below may be combined together as desired.

First Embodiment

Figure 1:
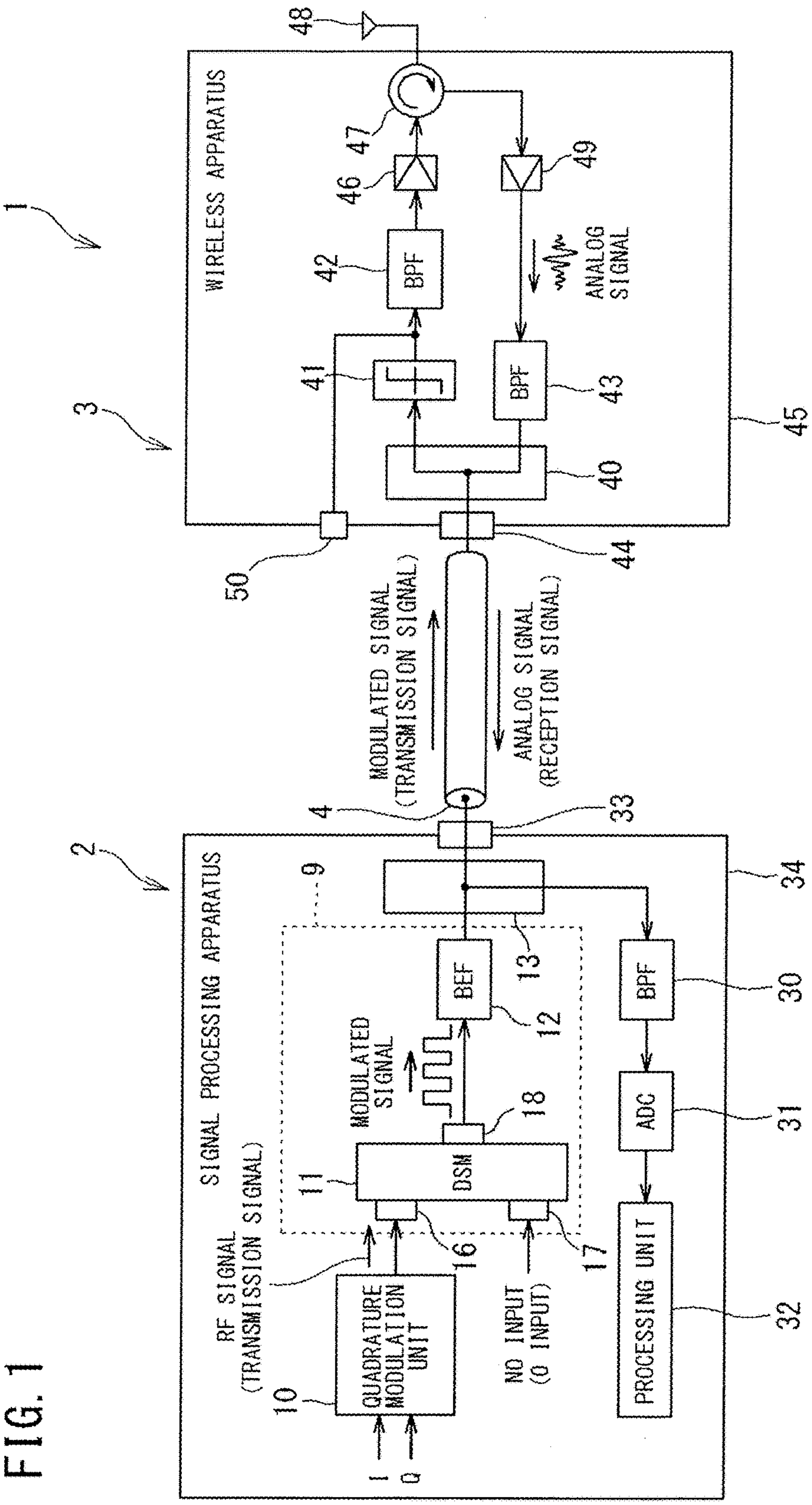
FIG. 1 is a block diagram showing a configuration of a communication system according to a first embodiment.

FIG. 1 is a block diagram showing a configuration of a communication system according to a first embodiment.

This communication system 1 is a system for wireless communication, and includes a signal processing apparatus 2 and a wireless apparatus 3.

The wireless apparatus 3 has a function of transmitting and receiving a radio signal.

The signal processing apparatus 2 provides a transmission signal to the wireless apparatus 3, and performs signal processing on a reception signal provided from the wireless apparatus 3.

The wireless apparatus 3 and the signal processing apparatus 2 are connected to each other by a signal cable 4 serving as a signal transmission path, and exchange communication signals such as a transmission signal and a reception signal via the signal cable 4.

The signal processing apparatus 2 constitutes an apparatus (first apparatus) that transmits a delta-sigma modulated signal to the wireless apparatus 3 via the signal cable 4. The delta-sigma modulated signal is a digital signal (pulse signal) obtained by performing delta-sigma modulation on a transmission signal (first signal) as an RF signal, as described later.

The wireless apparatus 3 constitutes an apparatus (second apparatus) that transmits a reception signal (second signal) as an RF signal to the signal processing apparatus 2 via the signal cable 4. The signal cable 4 has a function of a signal transmission path through which the delta-sigma modulated signal is transmitted between the signal processing apparatus 2 and the wireless apparatus 3. That is, the signal processing apparatus 2, the wireless apparatus 3, and the signal cable 4 constitute a transmission system that performs transmission of a delta-sigma modulated signal obtained through delta-sigma modulation.

The transmission signal and the reception signal indicate radio-frequency communication signals (RF signals) that are transmitted and received through wireless communication, and also include, for example, feedback signals obtained by monitoring these signals.

The signal processing apparatus 2 includes a quadrature modulation unit 10, a modulator 9, and a distributor/synthesizer 13.

The quadrature modulation unit 10 performs quadrature modulation on a digital baseband signal (an I (In-phase) signal and a Q (Quadrature-phase) signal), and up-converts the resultant signal to a signal having a radio frequency. The quadrature modulation unit 10 outputs an RF (Radio Frequency) signal that is the signal having the radio frequency. The RF signal outputted from the quadrature modulation unit 10 is a transmission signal to be wirelessly transmitted by the wireless apparatus 3.

The RF signal (transmission signal) outputted from the quadrature modulation unit 10 is provided to the modulator 9.

The modulator 9 performs delta-sigma modulation on the transmission signal outputted from the quadrature modulation unit 10, and outputs a delta-sigma modulated signal. The modulator 9 includes a delta-sigma modulator (DSM) 11 and a band elimination filter 12.

The delta-sigma modulator 11 performs delta-sigma modulation on the transmission signal outputted from the quadrature modulation unit 10, and outputs a delta-sigma modulated signal containing the transmission signal as a frequency component. The delta-sigma modulated signal outputted from the delta-sigma modulator 11 is a digital signal (pulse signal).

The delta-sigma modulator 11 according to the present embodiment is a multi-carrier delta-sigma modulator having two input ports through which signals can be inputted thereto.

Figure 2:
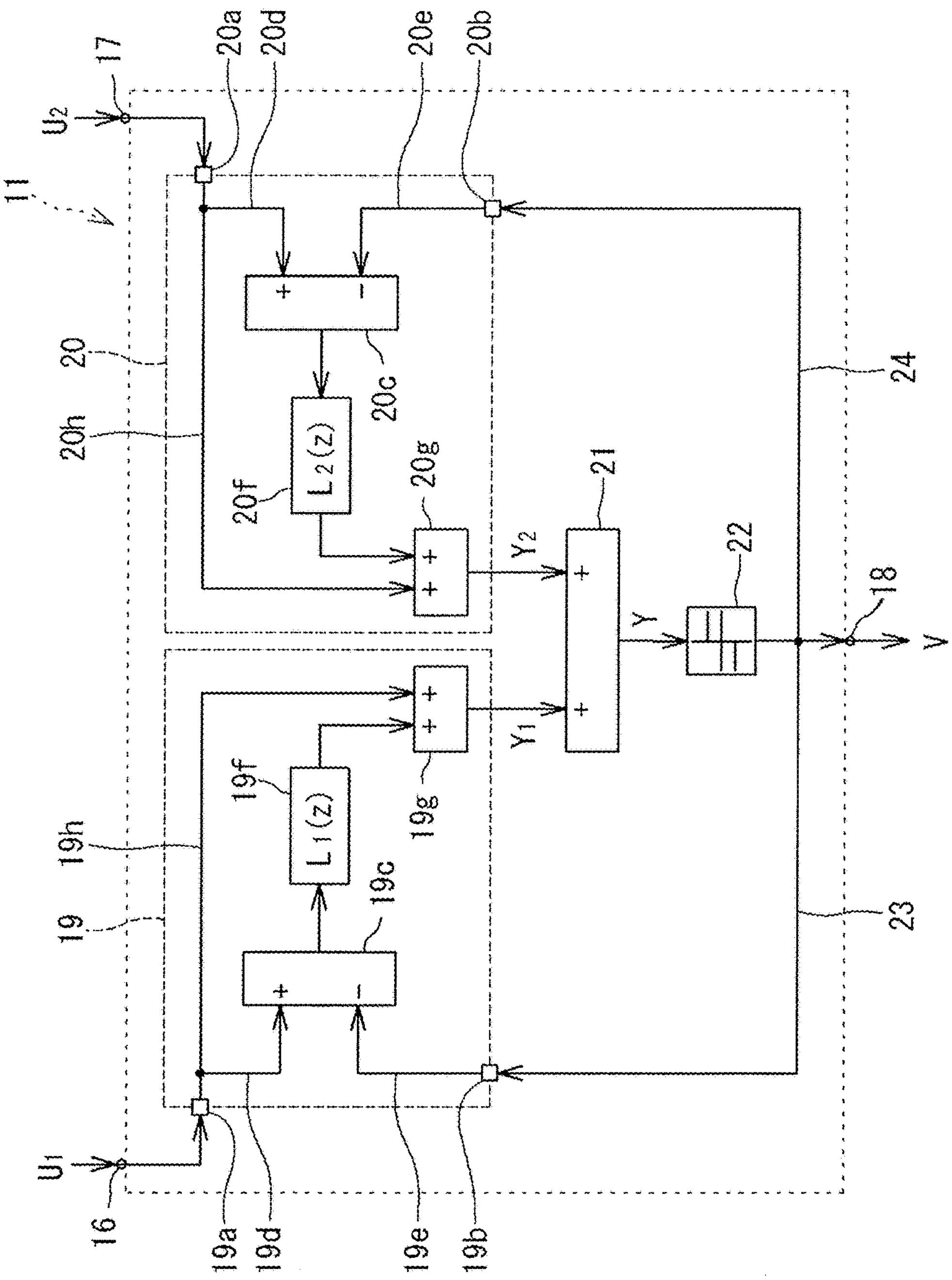
FIG. 2 is a block diagram showing an example of a delta-sigma modulator according to the present embodiment.

FIG. 2 is a block diagram showing an example of the delta-sigma modulator 11 according to the present embodiment.

The delta-sigma modulator 11 includes: a first input port 16 to which a first signal $U_1$ is inputted; a second input port 17 to which a second signal $U_2$ is inputted; and a single output port 18 from which a delta-sigma modulated signal is outputted. The delta-sigma modulator 11 includes: a plurality of loop filters (first loop filter 19 and second loop filter 20) corresponding to the plurality of input ports 16, 17, respectively; an adder 21; and a quantizer 22.

The plurality of loop filters 19, 20 include: first input nodes 19*a*, 20*a* connected to the corresponding input ports 16, 17, respectively; and second input nodes 19*b*, 20*b* connected to the output end of the quantizer 22 via feedback paths 23, 24, respectively.

To the first input nodes 19*a*, 20*a*, the input signals $U_1$, $U_2$, which have been inputted to the corresponding input ports 16, 17, are inputted, respectively. To the second input nodes 19*b*, 20*b*, a feedback signal V, which is an output V from the quantizer 22, is inputted.

The plurality of loop filters 19, 20 include differentiators 19*c*, 20*c*, respectively. To the differentiators 19*c*, 20*c*, first paths 19*d*, 20*d* connected to the first input nodes 19*a*, 20*a* and second paths 19*e*, 20*e* connected to the second input nodes 19*b*, 20*b*, are connected, respectively. The differentiators 19*c*, 20*c* calculate differences $U_1$-V, $U_2$-V between the input signals $U_1$, $U_2$ and the feedback signal V from the quantizer 22, respectively.

The differences $U_1$-V, $U_9$-V calculated by the differentiators 19*c*, 20*c* are inputted to inner filters 19*f*, 20*f* included in the loop filters 19, 20, respectively. A transfer function of the inner filter 19*f* of the first loop filter 19 is represented as $L_1(z)$, and a transfer function of the inner filter 20*f* of the second loop filter 20 is represented as $L_2(z)$.

The outputs $L_1(z)$ $(U_1(z)\text{-}V(z))$, $L_2(z)$ $(U_2(z)\text{-}V(z))$ from the inner filters 19*f*, 20*f* are provided to the adders 19*g*, 20*g* included in the loop filters 19, 20, respectively.

Feedforward paths 19*h*, 20*h*, which allow the input signals $U_1$, $U_2$ having been inputted to the first input nodes 19*a*, 20*a* to be inputted to the adders 19*g*, 20*g*, are connected to the adders 19*g*, 20*g*, respectively. Accordingly, the adders 19*g*, 20*g* add the input signals $U_1$, $U_2$ to the outputs $L_1(z)$ $(U_1(z)\text{-}V(z))$, $L_2(z)$ $(U_2(z)\text{-}V(z))$ from the inner filters 19*f*, 20*f*, respectively.

The outputs $Y_1$, $Y_2$ from the respective adders 19*g*, 20*g* (outputs from the respective loop filters 19, 20) are added to each other by the adder 21.

An output Y from the adder 21 is provided to the quantizer 22. The quantizer 22 of the present embodiment is a two-level quantizer, and outputs a 1-bit pulse train as a quantized signal (delta-sigma modulated signal) V. This quantized signal V is an output signal from the delta-sigma modulator 11. The output signal V is provided to the loop filters 19, 20 via the feedback paths 23, 24, respectively.

The output V from the delta-sigma modulator 11 is represented by the following equation (1) (when N=2 in equation (1)). In equation (1), $STF_i(z)$ represents an i-th signal transfer function with respect to an i-th input signal $U_i(z)$, NTF(z) represents a noise transfer function of the entire delta-sigma modulator 11, and E(z) represents a noise transfer function.

[Math. 1]

$$V(z) = \sum_{i=1}^{N} STFi(z)Ui(z) + NTF(z)E(z) \tag{1}$$

where N is the number of input signals.

[Math. 2]

$$STFi(z) = \{1 + Li(z)\} \Big/ \left\{1 + \sum_{x=1}^{N} Lx(z)\right\}$$

$$NTF(z) = 1 \Big/ \left\{1 + \sum_{x=1}^{N} Lx(z)\right\}$$

$$Lx(z) = (1/NTFx(z)) - 1$$

$$NTFx(z) = \prod_{i=1}^{M} \frac{z - z_{xi}}{z - p_{xi}},\ x = 1 \sim N$$

where M is the order of the delta-sigma modulator, $z_{xi}$ is a zero, and $p_{xi}$ is a pole.

The inner filter 19*f* of the first loop filter 19 has a transfer function $L_1$ (z) represented by use of a first noise transfer function $NTF_1(z)$. The first noise transfer function $NTF_1(z)$ is set to have a characteristic (band stop characteristic) of suppressing quantization noise in a band near the frequency of the first signal $U_1$ inputted to the first loop filter 19. That is, a center frequency of a band (quantization noise stop band), in the first noise transfer function $NTF_1(z)$, in which quantization noise can be suppressed, is the frequency of the first signal $U_1$.

The inner filter 20*f* of the second loop filter 20 has a transfer function $L_2(z)$ represented by use of a second noise transfer function $NTF_2(z)$. The second noise transfer function $NTF_2(z)$ is set to have a characteristic (band stop characteristic) in which quantization noise in a band near the frequency of the second signal $U_2$ inputted to the second loop filter 20 is suppressed. That is, a center frequency of a quantization noise stop band in the second noise transfer function $NTF_2(z)$ is the frequency of the second signal $U_2$.

The delta-sigma modulator 11 having the aforementioned configuration can simultaneously output the first signal $U_1$ inputted to the first input port 16 and the second signal $U_2$ inputted to the second input port 17 so as to be included in a delta-sigma modulated signal that is a single output signal V(z).

In the present embodiment, as described later, the transmission signal outputted from the quadrature modulation unit 10 is provided as the first signal $U_1$ to the delta-sigma modulator 11. Therefore, the first noise transfer function $NTF_1(z)$ of the first loop filter 19 is set such that the center frequency of the quantization noise stop band is a frequency $f_1$ of the transmission signal.

Meanwhile, no signal is inputted as the second signal $U_2$ to the delta-sigma modulator 11. However, the second noise transfer function $NTF_2(z)$ of the second loop filter 20 is set such that the center frequency of the quantization noise stop band is a frequency $f_2$ of a reception signal described later, which is different from the frequency $f_1$ of the transmission signal.

Figure 3:
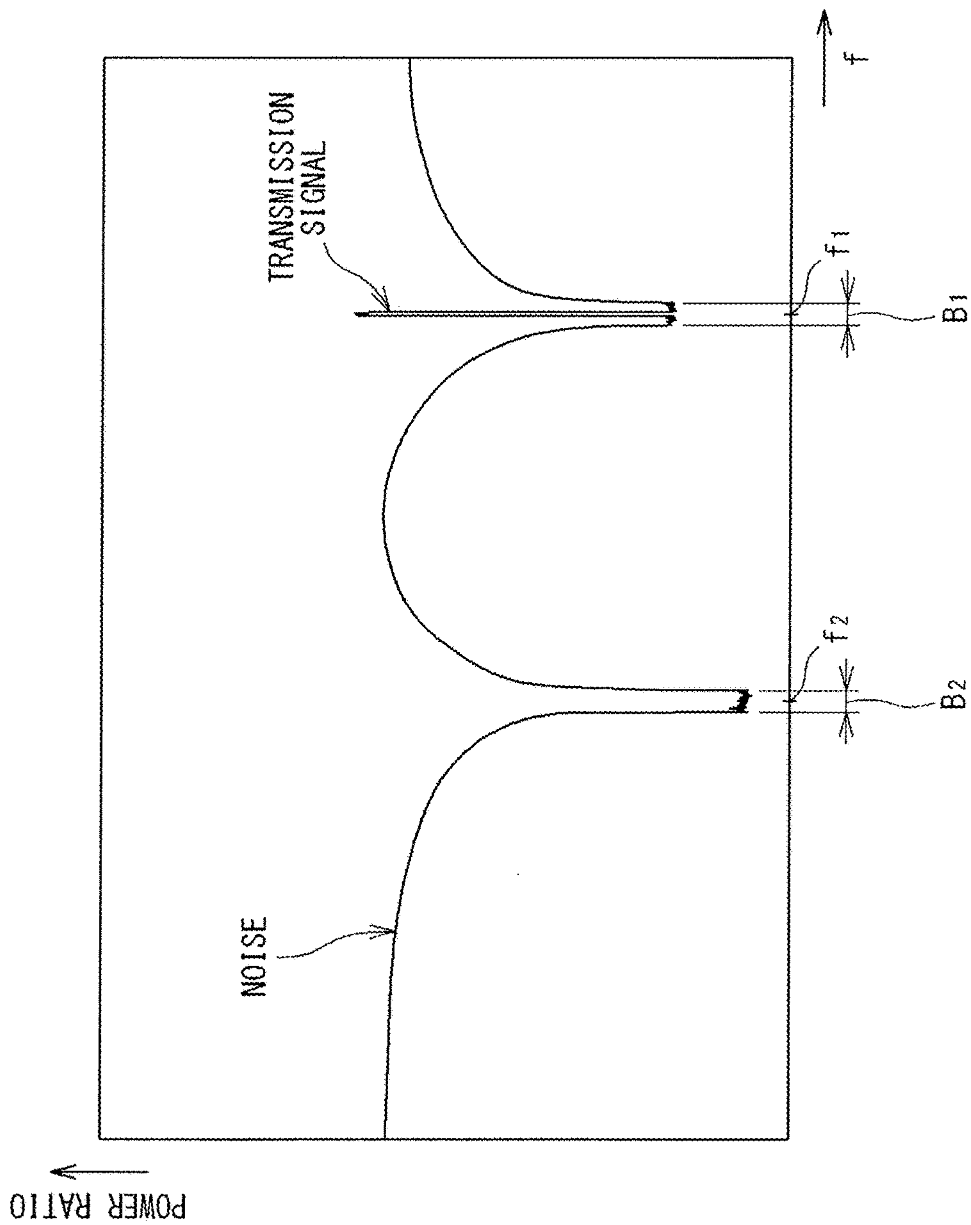
FIG. 3 is a diagram showing an example of a power spectrum of an output from the delta-sigma modulator according to the present embodiment.

FIG. 3 is a diagram showing an example of a power spectrum of an output from the delta-sigma modulator 11 according to the present embodiment.

As shown in FIG. 3, in the output (delta-sigma modulated signal) from the delta-sigma modulator 11, quantization noise is suppressed (subjected to noise shaping) in a band $B_1$ having the frequency $f_1$ of the transmission signal as the center frequency, and in a band $B_2$ having the frequency $f_2$ of the reception signal as the center frequency.

As described above, the center frequency of the quantization noise stop band in the first noise transfer function $NTF_1(z)$ is set to be the frequency $f_1$ of the transmission signal. Meanwhile, the center frequency of the quantization noise stop band in the second noise transfer function $NTF_2$ (z) is set to be the frequency $f_2$ of the reception signal.

Accordingly, as shown in FIG. 3, in the output from the delta-sigma modulator 11, a band in which quantization noise is suppressed appears in each of the band $B_1$ having the frequency $f_1$ of the transmission signal as the center frequency and the band $B_2$ having the frequency $f_2$ of the reception signal as the center frequency.

As described above, the delta-sigma modulator 11 has a characteristic of stopping the quantization noise in the band $B_1$ (first frequency band) including the frequency $f_1$ of the transmission signal, and stopping the quantization noise in the band $B_2$ (second frequency band) including the frequency $f_2$ of the reception signal.

The output from the delta-sigma modulator 11 has the transmission signal in the band $B_1$. On the other hand, since no signal is inputted as the second signal $U_2$ to the delta-sigma modulator 11 in the band $B_2$, the output from the delta-sigma modulator 11 has no signal in the band $B_2$.

Referring back to FIG. 1, the transmission signal outputted from the quadrature modulation unit 10 is provided to the first input port 16 of the delta-sigma modulator 11. Meanwhile, there is no input to the second input port 17 of the delta-sigma modulator 11.

The delta-sigma modulator 11 outputs the delta-sigma modulated signal through the output port 18.

The delta-sigma modulated signal outputted from the delta-sigma modulator 11 is provided to the band elimination filter 12.

The band elimination filter 12 has a signal elimination band including the frequency $f_2$ of the reception signal. The signal elimination band of the band elimination filter 12 according to the present embodiment is set to, for example, a frequency band including the band $B_2$, as a frequency band including the frequency $f_2$ of the reception signal.

Accordingly, when being provided with the delta-sigma modulated signal from the delta-sigma modulator 11, the band elimination filter 12 eliminates the quantization noise in the band $B_2$, from the delta-sigma modulated signal.

Figure 4:
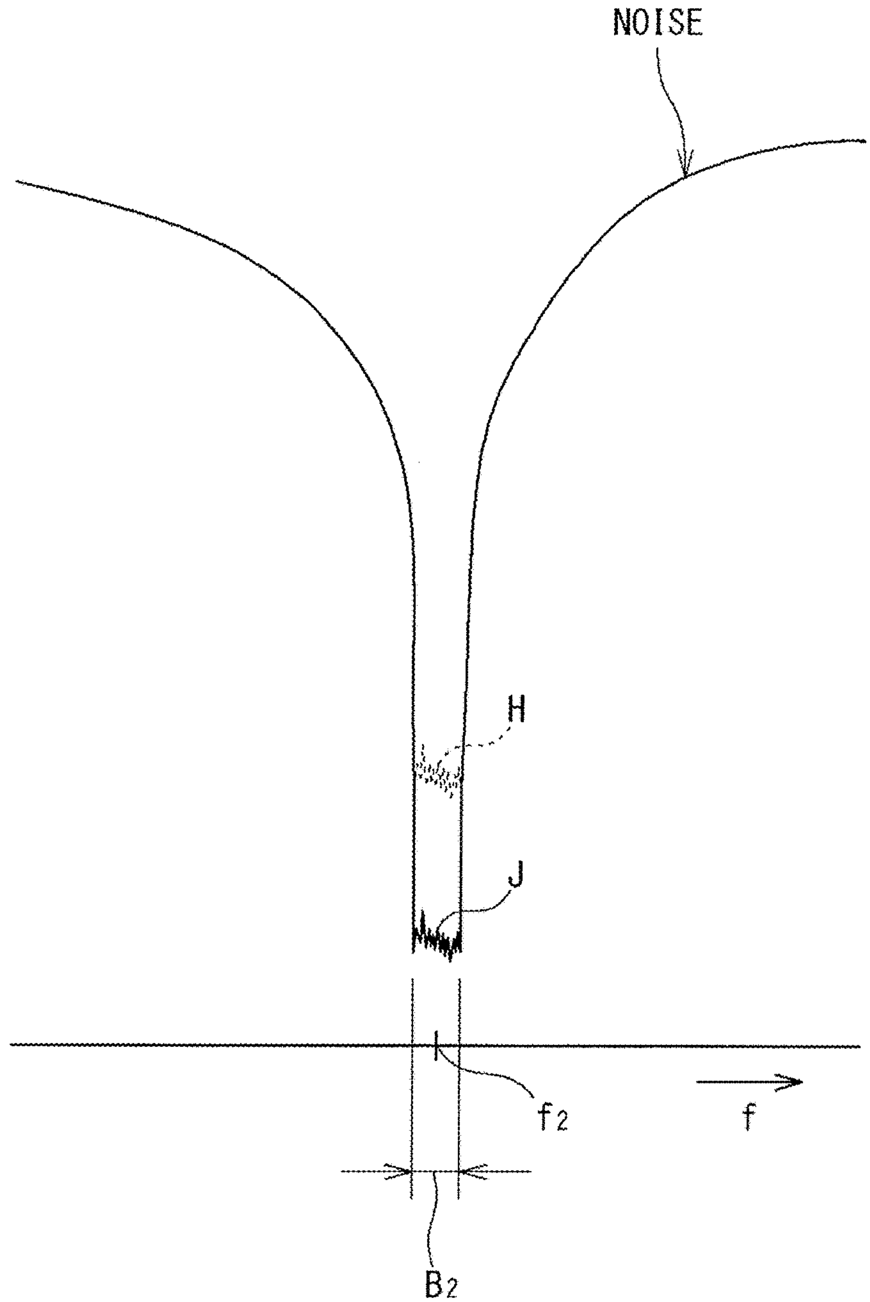
FIG. 4 is an enlarged view of a portion around a band $B_2$ in an output from a first band elimination filter.

FIG. 4 is an enlarged view of a portion around the band $B_2$ in the output from the first band elimination filter 12.

In FIG. 4, a broken line H indicates a profile of noise in the band $B_2$ in the delta-sigma modulated signal outputted from the delta-sigma modulator 11, and a solid line J indicates a profile of noise in the band $B_2$ in the delta-sigma modulated signal that has passed through the band elimination filter 12.

The quantization noise in the band $B_2$ is suppressed as compared with quantization noise in other bands, but still remains suppressible to some extent.

Therefore, when the delta-sigma modulated signal outputted from the delta-sigma modulator 11 has passed through the band elimination filter 12, the level of the quantization noise in the band $B_2$ is reduced from the broken line H to the solid line J, as shown in FIG. 4.

Thus, the band elimination filter 12 can further reduce the level of the quantization noise in the band $B_2$ in which the quantization noise has already been suppressed in the delta-sigma modulated signal.

Referring back to FIG. 1, as described above, the modulator 9 includes: the delta-sigma modulator 11 that performs delta-sigma modulation on the transmission signal; and the band elimination filter 12 that is provided with the output from the delta-sigma modulator 11, and has the signal elimination band including the frequency of the reception signal. The modulator 9 outputs the delta-sigma modulated signal that has passed through the band elimination filter 12.

The delta-sigma modulated signal, which has passed through the band elimination filter 12, is provided to the distributor/synthesizer 13.

The band elimination filter 12 of the modulator 9, the signal cable 4, and a first band-pass filter 30 are connected to the distributor/synthesizer 13. The distributor/synthesizer 13 connects these components to each other.

The first band-pass filter 30 connected to the distributor/synthesizer 13, and a processing unit 32 and an analog/digital converter (ADC) 31 connected to the first band-pass filter 30, will be described later in detail.

The delta-sigma modulated signal, which has been provided to the distributor/synthesizer 13, is provided to the signal cable 4 through a connector 33.

Thus, the signal processing apparatus 2 provides, to the signal cable 4, the delta-sigma modulated signal outputted from the band elimination filter 12.

The connector 33 is exposed to the outside of a housing 34 of the signal processing apparatus 2. The connector 33, with one end of the signal cable 4 being inserted therein, connects the signal cable 4 to the distributor/synthesizer 13.

The housing 34 of the signal processing apparatus 2 houses therein the quadrature modulation unit 10, the modulator 9, the distributor/synthesizer 13, and the like.

The other end of the signal cable 4 is connected to the wireless apparatus 3.

The wireless apparatus 3 includes a distributor/synthesizer 40, a binarizer 41, a second band-pass filter 42, and a third band-pass filter 43.

The signal cable 4, the binarizer 41, and the third band-pass filter 43 are connected to the distributor/synthesizer 40. The distributor/synthesizer 40 connects these components to each other.

The delta-sigma modulated signal, which has been provided to the signal cable 4, is provided to the distributor/synthesizer 40 through a connector 44.

The connector 44 is exposed to the outside of a housing 45 of the wireless apparatus 3. The connector 44, with the other end of the signal cable 4 being inserted therein, connects the signal cable 4 to the distributor/synthesizer 40.

Thus, the signal cable 4 connects the signal processing apparatus 2 to the wireless apparatus 3, thereby transmitting, to the wireless apparatus 3, the delta-sigma modulated signal outputted from the modulator 9.

The housing 45 of the wireless apparatus 3 houses therein functional units (described later) included in the wireless apparatus 3, in addition to the distributor/synthesizer 40, the binarizer 41, and the second band-pass filter 42.

The delta-sigma modulated signal, which has been provided to the distributor/synthesizer 40, is provided to the binarizer 41.

The binarizer 41 is composed of a comparator or the like. The binarizer 41 binarizes the delta-sigma modulated signal transmitted from the signal processing apparatus 2 through the signal cable 4, and outputs the binarized delta-sigma modulated signal.

The delta-sigma modulated signal to be provided to the wireless apparatus 3 through the signal cable 4 is attenuated while being transmitted, as compared to that just outputted from the modulator 9. The binarizer 41 binarizes the attenuated delta-sigma modulated signal. By binarizing the delta-sigma modulated signal that is a binary pulse signal, the attenuated delta-sigma modulated signal is restored to the delta-sigma modulated signal before being attenuated. Thus, the binarizer 41 can output a delta-sigma modulated signal approximate to the delta-sigma modulated signal before being attenuated, thereby obtaining the delta-sigma modulated signal in which influence of attenuation is mitigated.

The delta-sigma modulated signal outputted from the binarizer 41 is provided to the second band-pass filter 42.

The second band-pass filter 42 has a passband that allows the transmission signal as an RF signal to pass therethrough. Thereby, the second band-pass filter 42 can allow the transmission signal to pass therethrough while eliminating quantization noise that is present outside the band of the transmission signal in the delta-sigma modulated signal.

Therefore, the second band-pass filter 42, to which the delta-sigma modulated signal is provided, outputs the transmission signal.

An output terminal 50 is connected between the binarizer 41 and the second band-pass filter 42. The output terminal 50 is exposed to the outside of the housing 45. The delta-sigma modulated signal outputted from the binarizer 41 is provided to the output terminal 50. The output terminal 50 outputs the delta-sigma modulated signal which has been outputted from the binarizer 41.

Therefore, the delta-sigma modulated signal outputted from the binarizer 41 can be checked by connecting a device for measuring a signal to the output terminal 50, and measuring an output signal from the device. Thus, it is possible to check whether or not the delta-sigma modulated signal from the signal processing apparatus 2 is normally transmitted to the wireless apparatus 3.

A power amplifier 46, a circulator 47, and an antenna 48 are connected to a stage subsequent to the second band-pass filter 42.

The transmission signal outputted from the second band-pass filter 42 is amplified by the power amplifier 46, and the amplified transmission signal passes through the circulator 47 and is provided to the antenna 48. The transmission signal provided to the antenna 48 is emitted into space as a radio signal to be transmitted.

The antenna 48 receives a radio signal transmitted from another wireless apparatus. The antenna 48 provides, to the circulator 47, a reception signal (RF signal) as an analog signal obtained by receiving the radio signal. The reception signal has the frequency $f_2$.

A low-noise amplifier 49 is connected to a stage subsequent to the circulator 47. The low-noise amplifier 49 is further connected to the third band-pass filter 43.

The circulator 47 provides the reception signal to the low-noise amplifier 49. The reception signal is amplified by the low-noise amplifier 49, and the amplified reception signal is provided to the third band-pass filter 43.

The third band-pass filter 43 is set so as to have a signal pass band including the frequency $f_2$ of the reception signal as an RF signal, and block passing of the transmission signal. Therefore, for example, even if the component of the transmission signal passes through the low-noise amplifier 49 and reaches the third band-pass filter 43 through the circulator 47, the third band-pass filter 43 blocks passing of the component of the transmission signal.

Thus, the third band-pass filter 43 can block passing of an unnecessary signal while allowing a provided reception signal to pass therethrough.

The reception signal, which has passed through the third band-pass filter 43, is provided to the distributor/synthesizer 40 connected to a stage subsequent to the third band-pass filter 43.

As well as the third band-pass filter 43, the signal cable 4 and the binarizer 41 are connected to the distributor/synthesizer 40 as described above.

Therefore, the reception signal, which has been provided to the distributor/synthesizer 40, is provided to the signal cable 4.

The delta-sigma modulated signal outputted from the modulator 9 is also provided to the signal cable 4. Therefore, the reception signal and the delta-sigma modulated signal are added to each other in the signal cable 4. A signal obtained by adding the reception signal to the delta-sigma modulated signal is transmitted through the signal cable 4.

The delta-sigma modulated signal outputted from the delta-sigma modulator 11 (modulator 9) contains quantization noise over a wide band, as shown in FIG. 3.

Therefore, the reception signal provided to the signal cable 4 may be superimposed on the quantization noise contained in the delta-sigma modulated signal, while the delta-sigma modulated signal is being transmitted to the wireless apparatus 3.

In this regard, according to the present embodiment, in the delta-sigma modulated signal outputted from the delta-sigma modulator 11 (modulator 9), quantization noise at the frequency $f_2$ of the reception signal (quantization noise in the band $B_2$ including the frequency $f_2$ of a reception signal) is suppressed (refer to FIG. 3).

Therefore, the reception signal provided to the distributor/synthesizer 40 and the signal cable 4 can be inhibited from being superimposed on the quantization noise in the delta-sigma modulated signal. Thus, the signal cable 4 for transmitting the delta-sigma modulated signal from the modulator 9 can be caused to transmit the reception signal as an RF signal.

The delta-sigma modulator 11 of the present embodiment is a multi-carrier delta-sigma modulator having two input ports through which signals can be inputted therein. Therefore, when the transmission signal is inputted as the first signal $U_1$ while no signal is inputted as the second signal $U_2$, it is possible to provide, in the delta-sigma modulated signal, the band $B_2$ in which quantization noise is suppressed but a signal component to be outputted is not present.

According to the communication system 1 of the present embodiment, the band $B_2$ in which the quantization noise is suppressed is provided in a portion of the band of the delta-sigma modulated signal, and this band $B_2$ is used for signal transmission in the signal cable 4, thereby enabling the signal cable 4 to transmit the reception signal.

As a result, the delta-sigma modulated signal as a digital signal and the reception signal as an analog signal can be bidirectionally transmitted by using the signal cable 4 that is one transmission line.

Further, in the present embodiment, as shown in FIG. 4, the band elimination filter 12 included in the modulator 9 further reduces the level of the quantization noise in the band $B_2$, which is a band in which quantization noise is suppressed, in the delta-sigma modulated signal outputted from the delta-sigma modulator 11, whereby the signal quality, such as the signal-to-noise ratio of the reception signal having the frequency $f_7$ and transmitted through the signal cable 4, can be further improved.

As described above, the signal cable 4 is connected to the distributor/synthesizer 13 of the signal processing apparatus 2. Further, as described above, the first band-pass filter 30 is connected to the distributor/synthesizer 13.

Therefore, the signal transmitted through the signal cable 4 (the signal obtained by adding the delta-sigma modulated signal to the reception signal) is provided to the first band-pass filter 30.

Like the third band-pass filter 43, the first band-pass filter 30 is set so as to have a signal pass band including the frequency $f_2$ of the reception signal as an RF signal, and block passing of the transmission signal. Therefore, for example, even if the delta-sigma modulated signal provided to the distributor/synthesizer 13 reaches the first band-pass filter 30, the first band-pass filter 30 eliminates the component of the transmission signal and the noise component included in the delta-sigma modulated signal, and allows the reception signal to pass therethrough.

Therefore, when being provided with the signal transmitted through the signal cable 4, the first band-pass filter 30 outputs the reception signal.

The reception signal outputted from the first band-pass filter 30 is provided to the analog/digital converter 31 connected to a stage subsequent to the first band-pass filter 30.

The analog/digital converter 31 converts the reception signal as an analog signal into a digital signal. The analog/digital converter 31 provides the reception signal converted into the digital signal, to the processing unit 32 connected to a stage subsequent to the analog/digital converter 31.

The processing unit 32 performs predetermined processing on the provided reception signal.

As described above, since the signal processing apparatus 2 includes the first band-pass filter 30 that is connected between the processing unit 32 and the signal cable 4 and has a signal pass band including the frequency $f_2$ of the reception signal, the reception signal can be easily obtained with a simple structure.

As described above, in the present embodiment, the second noise transfer function $NTF_2(z)$ of the second loop filter 20 is set such that the center frequency of the quantization noise stop band of the delta-sigma modulator 11 is equal to the frequency $f_2$ of the reception signal, whereby the quantization noise stop band of the delta-sigma modulator 11 is set to the band $B_2$ that is a frequency band including the frequency $f_2$ of the reception signal. Therefore, the modulator 9 can be caused to output the delta-sigma modulated signal in which the quantization noise at the frequency $f_2$ of the reception signal is suppressed.

In the present embodiment, the modulator 9 includes the delta-sigma modulator 11, and the band elimination filter 12 to which the output from the delta-sigma modulator 11 is provided, and the signal elimination band of the band elimination filter 12 is set to a frequency band including the frequency $f_2$ of the reception signal.

Therefore, for example, if the band elimination filter 12 can suppress the quantization noise to an extent that the signal quality required of the reception signal is ensured, the quantization noise present at the frequency $f_2$ of the reception signal may be suppressed by using the band elimination filter 12 alone, without suppressing the quantization noise in the band including the frequency $f_2$ of the reception signal, in the delta-sigma modulated signal outputted from the delta-sigma modulator 11.

Also in this case, the modulator 9 can be caused to output the delta-sigma modulated signal in which the quantization noise present at the frequency $f_2$ of the reception signal is suppressed.

Conversely, if the quantization noise can be suppressed to an extent that the signal quality required of the reception signal is ensured by causing the delta-sigma modulator 11 to output the delta-sigma modulated signal in which the quantization noise in the band including the frequency $f_2$ of the reception signal is suppressed, the output from the delta-sigma modulator 11 may be provided to the signal cable 4 without the intervening band elimination filter 12.

However, as in the present embodiment, when the delta-sigma modulator 11 is caused to output the delta-sigma modulated signal in which the quantization noise at the frequency $f_2$ of the reception signal is suppressed, and the delta-sigma modulated signal is provided to the band elimination filter 12, it is possible to further reduce the level of the quantization noise in the band $B_z$ in the output from the modulator 9, thereby further improving the signal quality such as the signal-to-noise ratio of the reception signal transmitted to the signal cable 4.

As shown in FIG. 3, in the output from the delta-sigma modulator 11, a steep boundary edge appears between the band in which the quantization noise is suppressed and the band in which the quantization noise is not suppressed. Therefore, when the delta-sigma modulator 11 is combined with the band elimination filter 12, even if the filter characteristic of the band elimination filter 12 is comparatively slow, the characteristic at the boundary between the band in which the quantization noise is suppressed and the band in which the quantization noise is not suppressed is not deteriorated, whereby the allowable range of the filter characteristic of the band elimination filter 12 can be ensured to be wide.

In the present embodiment, the transmission signal and the reception signal have different frequencies. Therefore, the quantization noise stop band of the delta-sigma modulator 11 is set to both the band $B_1$ that is a frequency band including the frequency $f_1$ of the transmission signal and the band $B_1$ that is a frequency band including the frequency $f_2$ of the reception signal. Thus, the reception signal is inhibited from being superimposed on the quantization noise, and the signal cable 4 for transmitting the output of the modulator 9 to the wireless apparatus 3 can be caused to transmit the reception signal as an RF signal.

In the present embodiment, the transmission signal and the reception signal have different frequencies, and the wireless apparatus 3 provides the reception signal to the signal cable 4 without performing frequency conversion on the reception signal. However, for example, a frequency converter may be provided between the low-noise amplifier 49 and the third band-pass filter 43. In this case, even when the frequency of the reception signal is the same as that of the transmission signal or is not included in the quantization noise stop band of the delta-sigma modulator 11 and a block band of the band elimination filter 12, the aforementioned frequency converter can adjust the frequency of the reception signal so as to be included in the quantization noise stop band of the delta-sigma modulator 11 and the block band of the band elimination filter 12.

Figure 5A:
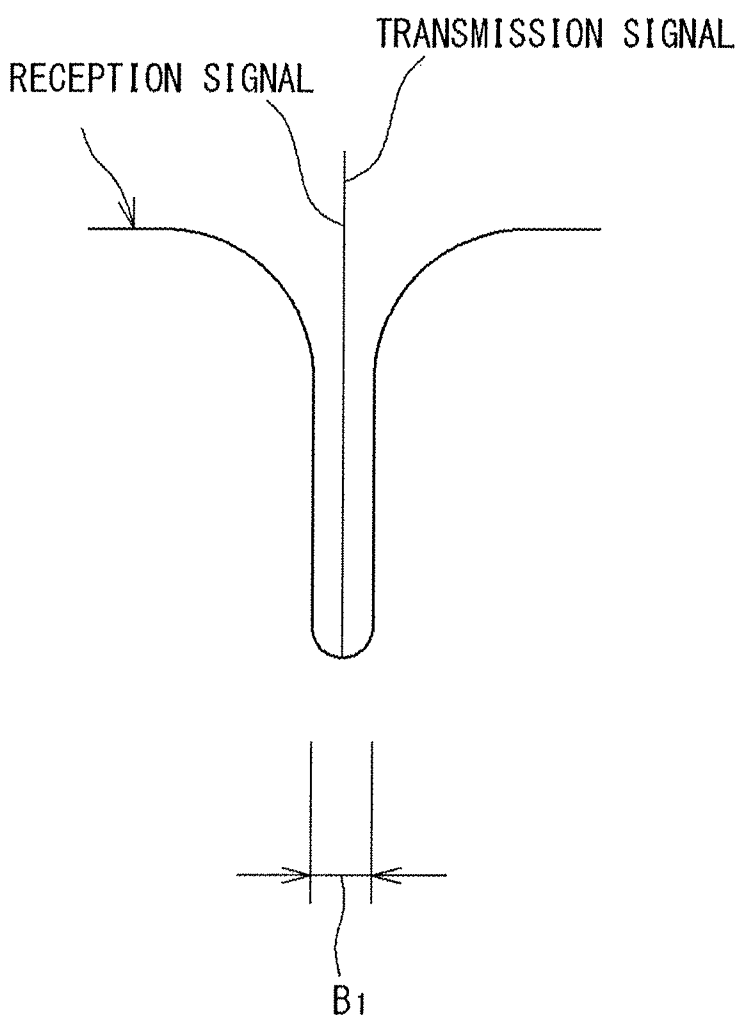
FIG. 5A is a diagram showing a part of a power spectrum of an output from a delta-sigma modulator according to a modification.

In the present embodiment, the quantization noise stop band of the delta-sigma modulator 11 is set to both the band $B_1$ that is a frequency band including the frequency $f_1$ of the transmission signal, and the band $B_1$ that is a frequency band including the frequency $f_2$ of the reception signal. However, for example, when transmission and reception are performed by time division duplex, the transmission signal included in the delta-sigma modulated signal and the reception signal added to the delta-sigma modulated signal do not overlap each other. Therefore, when transmission and reception are performed by time division duplex, even if the frequencies of the transmission signal and the reception signal are the same or overlap each other, the reception signal can be transmitted by using the band $B_1$ that is a frequency band including the frequency $f_1$ of the transmission signal, as shown in FIG. 5A.

Figure 5B:
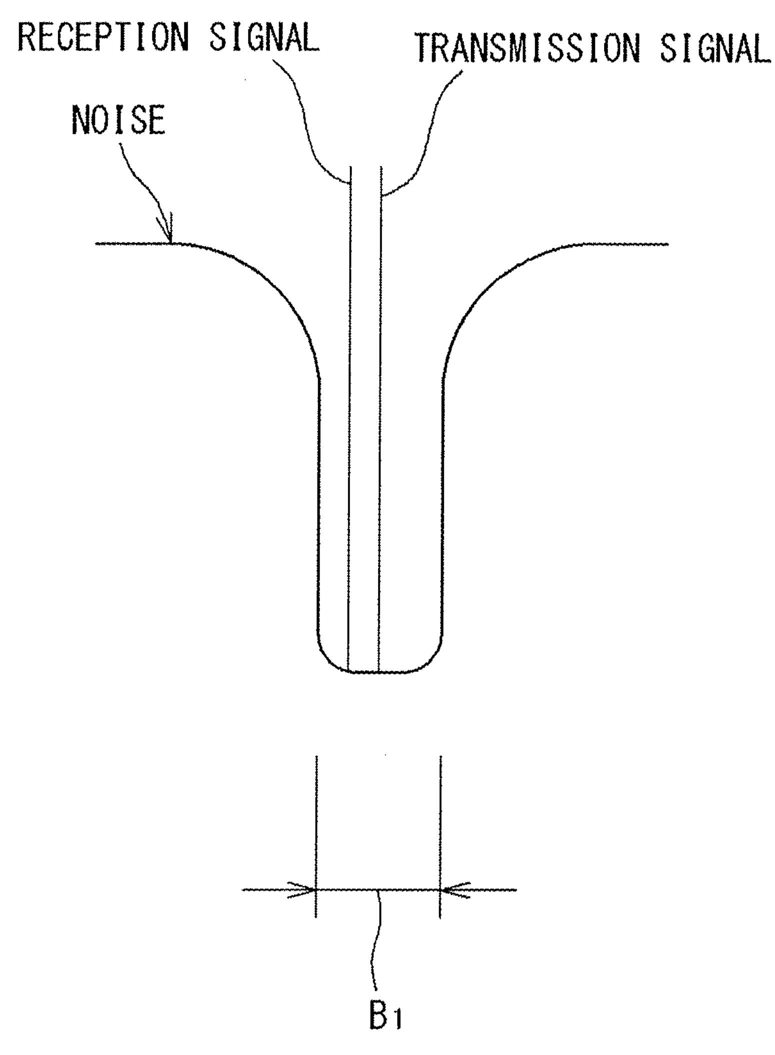
FIG. 5B is a diagram showing a part of a power spectrum of an output from a delta-sigma modulator according to another modification.

As shown in FIG. 5B, also when the reception signal can be transmitted within the band $B_1$ without having influence on the transmission signal, the reception signal can be transmitted by using the band $B_1$.

As described above, the band in which the quantization noise is stopped by using the delta-sigma modulator 11 can be set to a frequency band including the frequency of the transmission signal and the frequency of the reception signal.

Also in this case, the reception signal is inhibited from being superimposed on the quantization noise, and the signal cable 4 for transmitting the output of the modulator 9 to the wireless apparatus 3 can be caused to transmit the reception signal as an RF signal.

Second Embodiment

Figure 6:
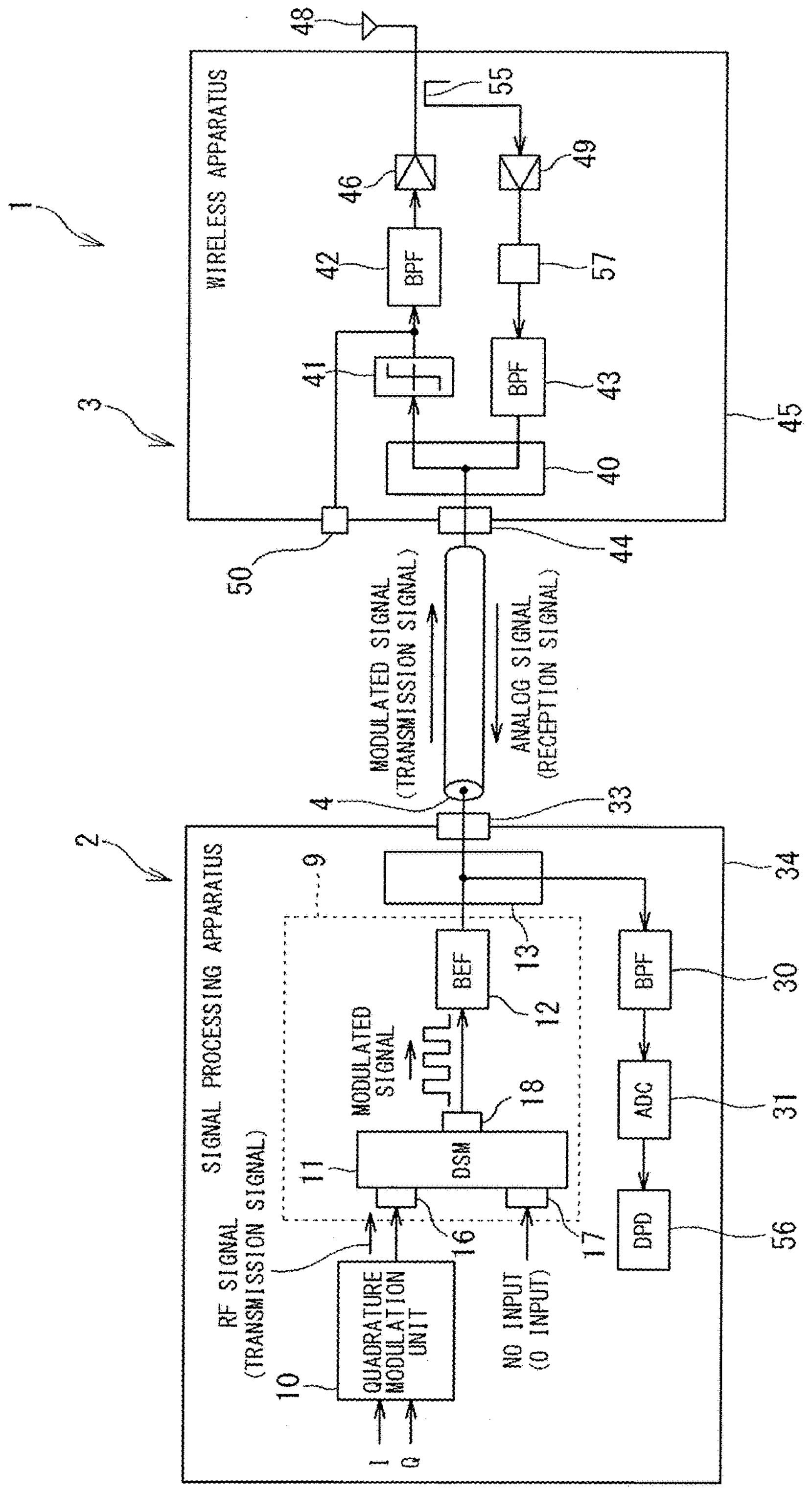
FIG. 6 is a block diagram showing a configuration of a communication system according to a second embodiment.

FIG. 6 is a block diagram showing a configuration of a communication system according to a second embodiment.

The present embodiment is different from the first embodiment mainly in that a coupler 55 is provided between the power amplifier 46 and the antenna 48, and the wireless apparatus 3 provides the transmission signal, which is outputted from the second band-pass filter 42, to the signal cable 4 as a feedback signal.

That is, the wireless apparatus 3 of the present embodiment transmits the feedback signal (second signal) as an RF signal to the signal processing apparatus 2 via the signal cable 4.

The coupler 55 obtains a feedback signal (frequency $f_1$) based on the transmission signal as an analog signal obtained from the delta-sigma modulated signal, and provides the obtained feedback signal to the low-noise amplifier 49 as a signal.

In the present embodiment, a frequency converter 57 is provided between the low-noise amplifier 49 and the third band-pass filter 43.

The frequency converter 57 performs frequency conversion on the feedback signal having the frequency $f_1$, which has been amplified by the low-noise amplifier 49. The frequency converter 57 converts the frequency of the feedback signal so as to be included in the quantization noise stop band of the delta-sigma modulator 11 and in the block band of the band elimination filter 12.

More specifically, the band $B_2$ (FIG. 3, FIG. 4), which is provided in the output of the delta-sigma modulator 11 (modulator 9) and in which quantization noise is suppressed but a signal component to be outputted is not present, is formed by the second loop filter 20 in which the center frequency of the quantization noise stop band is set at frequency $f_2$.

Therefore, the frequency converter 57 converts the frequency of the feedback signal to the frequency $f_2$. Thus, the frequency of the feedback signal obtained by the coupler 55 can be included in the quantization noise stop band of the delta-sigma modulator 11 and in the block band of the band elimination filter 12.

The wireless apparatus 3 provides the feedback signal obtained by the coupler 55 to the signal cable 4. The feedback signal is added to the delta-sigma modulated signal provided to the signal cable 4. A signal obtained by adding the feedback signal to the delta-sigma modulated signal is transmitted through the signal cable 4.

Since the frequency of the feedback signal obtained by the coupler 55 is converted to the frequency $f_2$, the feedback signal can be transmitted through the signal cable 4 by using the band $B_2$.

As a result, also in the present embodiment, the delta-sigma modulated signal as a digital signal and the feedback signal as an analog signal can be bidirectionally transmitted by using the signal cable 4 that is one transmission line.

As in the first embodiment, also in the present embodiment, the signal transmitted through the signal cable 4 (the signal obtained by adding the feedback signal to the delta-sigma modulated signal) is provided to the first band-pass filter 30.

When being provided with the signal transmitted through the signal cable 4, the first band-pass filter 30 outputs the feedback signal.

The feedback signal outputted from the first band-pass filter 30 passes through the analog/digital converter 31 and is provided to a digital pre-distortion (DPD) unit 56 connected to a stage subsequent to the analog/digital converter 31.

The digital pre-distortion unit 56 performs distortion compensation based on the feedback signal transmitted from the wireless apparatus 3.

Third Embodiment

Figure 7:
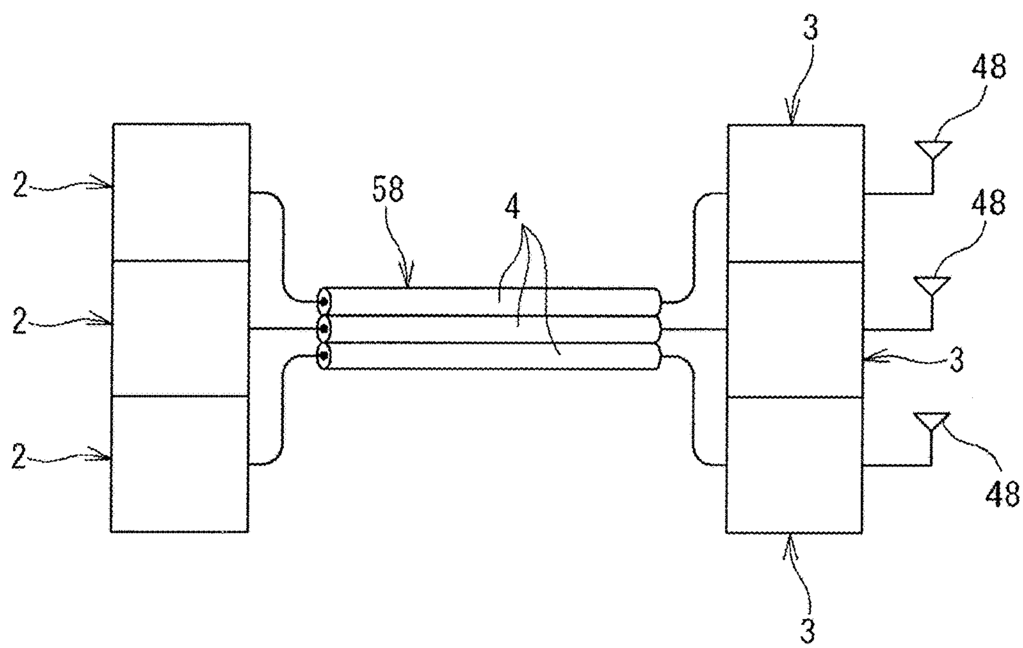
FIG. 7 is a diagram showing a configuration of a communication system according to a third embodiment.

FIG. 7 is a diagram showing a configuration of a communication system 1 according to a third embodiment.

The present embodiment is different from the first embodiment mainly in that a plurality of (three in the illustrated example) wireless apparatuses 3 are provided, and a plurality of signal processing apparatuses 2 corresponding to the respective wireless apparatuses 3 are provided.

As shown in FIG. 7, the respective wireless apparatuses 3 are connected to the corresponding signal processing apparatuses 2 by signal cables 4. The signal cables 4 of the present embodiment form a multicore wire 58 having the signal cables 4 as core wires. That is, the respective wireless apparatuses 3 are connected to the corresponding signal processing apparatuses 2 by the multicore wire 58.

Figure 8:
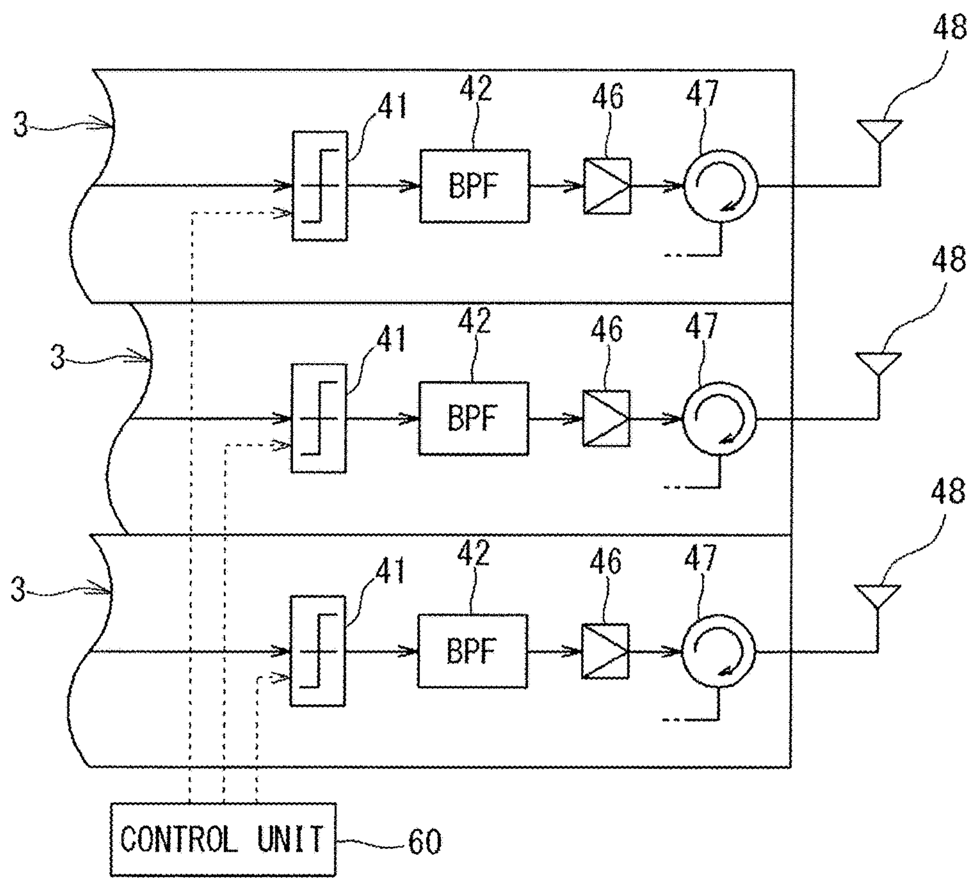
FIG. 8 is a diagram showing a part of a configuration of a wireless apparatus.

FIG. 8 is a diagram showing a part of the configuration of the wireless apparatus 3.

The communication system 1 of the present embodiment includes a control unit 60 for controlling the binarizers 41 included in the respective wireless apparatuses 3.

The control unit 60 adjusts the output timings of the delta-sigma modulated signals from the binarizers 41 of the respective wireless apparatuses 3. By adjusting the output timings of the delta-sigma modulated signals from the binarizers 41, the control unit 60 can adjust the transmission timings of the transmission signals from the respective wireless apparatuses 3.

For example, even when the respective signal processing apparatuses 2 simultaneously output the delta-sigma modulated signals in order to cause the respective wireless apparatuses 3 to transmit similar transmission signals in synchronization with each other, if delay occurs in each signal cable 4, the timings when the delta-sigma modulated signals reach the respective wireless apparatuses 3 become asynchronous, and the respective wireless apparatuses 3 cannot transmit the transmission signals at the same timing.

In order to inhibit such delay in each signal cable 4, it is conceivable to take a countermeasure, such as making the physical line lengths and/or transmission characteristics of the signal cables 4 coincide with each other. However, such a countermeasure may cause cost increase and complexity and/or size increase of the system, and moreover, may fail in sufficiently inhibiting the delay.

In this regard, the control unit 60 of the communication system 1 according to the present embodiment adjusts the output timings of the delta-sigma modulated signals from the respective binarizers 41, thereby adjusting the transmission timings of the transmission signals from the respective wireless apparatuses 3. Therefore, the transmission timings of the respective transmission signals can be accurately adjusted, for example, the transmission timings of the transmission signals from the respective wireless apparatuses 3 can be synchronized with each other, by a simple structure, without the necessity of exactly adjusting the physical line lengths of the signal cables 4 or making the transmission characteristics of the signal cables 4 exactly coincide with each other.

In the communication system 1 of the present embodiment, the respective wireless apparatuses 3 are connected to the corresponding signal processing apparatuses 2 by the multicore wire 58 having the signal cables 4 as core wires. Therefore, connection between the wireless apparatuses 3 and the signal processing apparatuses 2 is facilitated. Further, when the multicore wire 58 is used, it is conceivable that mutual interference may occur between the respective signal cables 4 and thereby delay may occur in the signal timing.

In this regard, in the communication system 1 of the present embodiment, the transmission timing can be adjusted by the control unit 60, thereby avoiding delay in the transmission timing due to the use of the multicore wire 58.

That is, since the communication system 1 of the present embodiment can avoid delay in the transmission timing due to the signal cables 4, signal cables having different lengths or different characteristics can be used, or general-purpose low-cost cables can be used.

In the above embodiments, the control unit 60 controls the binarizer 41 to adjust the timing of the delta-sigma modulated signal in the wireless apparatus 3. However, for example, an FiFo memory (First-in First-out memory) may be provided between the binarizer 41 and the second band-pass filter 42, and the control unit 60 may be caused to control the operation timing of the FiFo memory, thereby adjusting the timing of the delta-sigma modulated signal in the wireless apparatus 3.

[Others]

It is noted that the embodiments disclosed herein are merely illustrative in all aspects and should not be recognized as being restrictive.

In the embodiments described above, the two-input delta-sigma modulator 11 is used, but a delta-sigma modulator 11 having more inputs such as three inputs or four inputs may be used.

For example, when a three-input delta-sigma modulator 11 is used, three bands in which quantization noise is suppressed can be provided in the band of the delta-sigma modulated signal. As a result, in addition to the delta-sigma modulated signal outputted from the delta-sigma modulator 11, more two analog signals can be transmitted by using the signal cable 4.

The scope of the present invention is defined by the scope of the claims rather than by the meaning described above, and is intended to include meaning equivalent to the scope of the claims and all modifications within the scope.

REFERENCE SIGNS LIST

1 communication system
2 signal processing apparatus
3 wireless apparatus
4 signal cable
9 modulator
10 quadrature modulation unit
11 delta-sigma modulator
12 band elimination filter
13 distributor/synthesizer
16 first input port
17 second input port
18 output port
19 first loop filter
19*a* first input node
19*b* second input node
19*c* differentiator
19*d* first path
19*e* second path
19*f* inner filter
19*g* adder
19*h* feedforward path
20 second loop filter
20*a* first input node
20*b* second input node
20*c* differentiator
20*d* first path
20*e* second path
20*f* inner filter
20*g* adder
20*h* feedforward path
21 adder
22 quantizer
23, 24 feedback path
30 first band-pass filter
31 analog/digital converter
32 processing unit
33 connector
34 housing
40 distributor/synthesizer
41 binarizer
42 second band-pass filter
43 third band-pass filter
44 connector
45 housing
46 power amplifier
47 circulator
48 antenna
49 low-noise amplifier
50 output terminal
55 coupler
56 digital pre-distortion unit
57 frequency converter
58 multicore wire
60 control unit.

The invention claimed is:

1. A transmission system comprising:

a first apparatus configured to transmit, via a signal transmission path, a delta-sigma modulated signal obtained by performing delta-sigma modulation on a first signal that is an RF signal; and a second apparatus configured to transmit, via the signal transmission path, a second signal that is an RF signal, wherein the first apparatus transmits the delta-sigma modulated signal to the second apparatus, the second apparatus transmits the second signal to the first apparatus, in the delta-sigma modulated signal, quantization noise is suppressed at a frequency of the second signal, and the second signal is transmitted to the first apparatus while the delta-sigma modulated signal is being transmitted to the second apparatus.

2. The transmission system according to claim 1, wherein the first apparatus includes a delta-sigma modulator configured to perform delta-sigma modulation on the first signal, and the delta-sigma modulator has a characteristic to stop quantization noise in a frequency band including a frequency of the first signal and the frequency of the second signal.

3. The transmission system according to claim 1, wherein the first apparatus includes a delta-sigma modulator configured to perform delta-sigma modulation on the first signal, and the delta-sigma modulator has a characteristic to stop quantization noise in a first frequency band including a frequency of the first signal, and stop quantization noise in a second frequency band including a frequency of the second signal.

4. The transmission system according to claim 1, wherein the first apparatus includes a delta-sigma modulator configured to perform delta-sigma modulation on the first signal, and a band elimination filter to which an output from the delta-sigma modulator is provided and which has a signal elimination band including a frequency of the second signal, and an output from the band elimination filter is transmitted as the delta-sigma modulated signal to the second apparatus.

5. The transmission system according to claim 1, wherein the second signal is a reception signal received by a reception device configured to receive a radio signal.

6. The transmission system according to claim 1, wherein the second signal is a feedback signal of a transmission signal that is wirelessly transmitted by a transmission device configured to transmit a radio signal.

7. The transmission system according to claim 1, wherein the first apparatus includes:

a processing unit configured to process the second signal; and a bandpass filter connected between the processing unit and the signal transmission path, and having a signal pass band including a frequency of the second signal.

8. The transmission system according to claim 1, wherein the second apparatus includes a binarizer configured to binarize the delta-sigma modulated signal provided through the signal transmission path.

9. A wireless communication system including the transmission system according to claim 1 and configured to wirelessly transmit the first signal, wherein the second apparatus includes a plurality of reception units configured to receive the delta-sigma modulated signal, and the plurality of reception units include:

a plurality of wireless transmission units, respectively, configured to wirelessly transmit RF signals obtained from the delta-sigma modulated signal; and a control unit configured to adjust timings of the delta-sigma modulated signal in the plurality of wireless transmission units, thereby adjusting transmission timings of the first signal to be wirelessly transmitted from the respective wireless transmission units.

10. The wireless communication system according to claim 9, wherein a plurality of signal transmission paths configured to connect the plurality of reception units to the first apparatus form a multicore wire having the plurality of signal transmission paths as a core wire.

* * * * *